United States Patent
DeBrosse et al.

(10) Patent No.: US 10,437,665 B2
(45) Date of Patent: *Oct. 8, 2019

(54) BAD BIT REGISTER FOR MEMORY

(71) Applicant: INTERNATIONAL BUSINESS MACHINES CORPORATION, Armonk, NY (US)

(72) Inventors: John K. DeBrosse, Colchester, VT (US); Daniel C. Worledge, Cortlandt Manor, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 50 days.

This patent is subject to a terminal disclaimer.

(21) Appl. No.: 15/842,692

(22) Filed: Dec. 14, 2017

(65) Prior Publication Data

US 2018/0373589 A1     Dec. 27, 2018

Related U.S. Application Data

(63) Continuation of application No. 15/630,538, filed on Jun. 22, 2017.

(51) Int. Cl.
*G11C 29/00* (2006.01)
*G06F 11/10* (2006.01)
(Continued)

(52) U.S. Cl.
CPC ...... *G06F 11/1016* (2013.01); *G11C 11/1677* (2013.01); *H03M 13/2764* (2013.01);
(Continued)

(58) Field of Classification Search
CPC ............ G06F 11/1016; H03M 13/2764; H01L 27/222; H01L 43/08; H04L 1/0071
See application file for complete search history.

(56) References Cited

U.S. PATENT DOCUMENTS 5,475,693 A    12/1995  Christopherson et al.
5,687,353 A    11/1997  Chen et al.
(Continued)

FOREIGN PATENT DOCUMENTS

CN        102592680        7/2012

OTHER PUBLICATIONS

List of IBM Patents or Patent Applications Treated as Related dated Dec. 14, 2017, 2 pages.
(Continued)

*Primary Examiner* — Samir W Rizk
(74) *Attorney, Agent, or Firm* — Tutunjian & Bitetto, P.C.; Vazken Alexanian

(57) ABSTRACT

A memory device, a memory system, and corresponding methods are provided. The memory device includes a non-volatile random access memory. The non-volatile memory includes a suspect bit register configured to store addresses of bits that are determined to have had errors. The non-volatile memory further includes a bad bit register configured to store addresses of bits that both (i) appeared in the suspect bit register due to a first error and (ii) are determined to have had a second error. Hence, the memory device overcomes the aforementioned intrinsic write-error-rate by identifying the bad bits so they can be fused out, thus avoiding errors during use of the non-volatile random access memory.

16 Claims, 8 Drawing Sheets

(51) Int. Cl.
*H03M 13/27* (2006.01)
*G11C 11/16* (2006.01)
*H01L 27/22* (2006.01)
*H01L 43/08* (2006.01)
*H04L 1/00* (2006.01)

(52) U.S. Cl.
CPC ............ *H01L 27/222* (2013.01); *H01L 43/08* (2013.01); *H04L 1/0071* (2013.01)

(56) References Cited

U.S. PATENT DOCUMENTS

| | | | |
|---|---|---|---|
| 5,710,937 A * | 1/1998 | Kasahara | G06F 7/24 707/752 |
| 8,910,021 B2 | 12/2014 | Shalvi et al. | |
| 9,406,396 B2 | 8/2016 | Sehgal et al. | |
| 2014/0029362 A1 | 1/2014 | Adham et al. | |
| 2016/0284422 A9 | 9/2016 | Ong | |

OTHER PUBLICATIONS

International Search Report and Written Opinion dated Oct. 10, 2018 for International Application No. PCT/IB2018/054195, 9 pages.

\* cited by examiner

BAD BIT REGISTER FOR MEMORY

BACKGROUND

Technical Field

The present invention relates generally to memories and, in particular, to a bad bit register for a memory.

Description of the Related Art

Some multi-time-programmable non-volatile memories, for example Spin Torque MRAM, are plagued by the problem of having an intrinsic write-error-rate. This means that every time any bit is written, there is some non-zero probability that the bit will not write to the correct state. Typically, the error-rate for such errors is engineered to be very low, for example 1e-9 errors/write or less. However, in many applications this is not sufficient, particularly if some bits have worse write-error-rates than other bits. As used herein, the term "bad bit" refers to a bit that has a worse write error rate than other bits, e.g., above a threshold number of other bits and/or above a threshold write error rate. In that case, the bad bits will eventually cause errors in the field.

One way to deal with this problem is to use error correction code, which can correct some forms of errors. For example, some codes can correct for one error in a word of 72 bits, but not for two errors. However, if there are bad bits with sufficiently high write-error-rates, then eventually they will cause an uncorrectable error (for example, two errors in one word).

Another way to deal with this problem is to identify and fuse-out these bad bits in the factory, at a burn-in test. A fuse bit register in the memory records the address of words including bad bits, as identified during the burn-in test. These addresses are then used to fuse out those words so that other, redundant words are used instead. However, this is often impractical for solving the problem of bad write-error-rate bits. For example, it may require writing and reading every bit 1e9 times during a burn-in test, which would take too long and thus be too expensive.

Thus, there is a need for an improved way to manage bad bits in a memory that overcomes the aforementioned problem.

SUMMARY

According to an aspect of the present invention, a memory device is provided. The memory device includes a non-volatile random access memory. The non-volatile memory includes a suspect bit register configured to store addresses of bits that are determined to have had errors. The non-volatile memory further includes a bad bit register configured to store addresses of bits that both (i) appeared in the suspect bit register due to a first error and (ii) are determined to have had a second error. Hence, the memory device overcomes the aforementioned problem of some bits having worse write-error-rate than others, by identifying the bad bits so they can be fused out, thus avoiding errors during use of the non-volatile random access memory.

A corresponding computer-implemented method is also provided.

Moreover, the following preferred features are provided.

In an embodiment, the suspect bit register is configured to store the addresses of the bits that are determined to have had the errors occurring subsequent to a burn-in process, and the memory device further includes a main register configured to identify bits determined to have errors during a burn-in process. Hence, burn-in errors can be addressed by the present invention.

In an embodiment, the main register and the bad bit register are configured as a fuse bit register. Hence, bad bits can be fused out so that they are no longer used.

In an embodiment, the main register and the fuse bit register are included in the non-volatile random access memory. Hence, a single device can be used to provide the aforementioned registers, thus avoiding the use of other devices to implement the present invention.

According to another aspect of the present invention, a memory system is provided. The memory system includes a bad bit register configured to store addresses of words that include bits determined to have an unacceptable write-error rate. The memory system further includes a suspect bit register configured to identify bad bits to write into the bad bit register. The memory system further includes a processor. The processor is configured to search for an address of a bit relating to the error in the suspect bit register, responsive to detecting an error using an error correction code. The processor is further configured to remove the address of the bit relating to the error from the suspect bit register and write the address of the bit relating to the error into the bad bit register, responsive to a presence of the match. Hence, the memory system overcomes the aforementioned intrinsic write-error-rate by identifying the bad bits so they can be fused out, thus avoiding errors during use of the memory system.

A corresponding computer-implemented method is also provided.

Moreover, the following preferred features are provided.

In an embodiment, the processor is configured to write the address of the bit relating to the error into the suspect bit register, responsive to an absence of the match. Hence, suspect bits can be identified for subsequent consideration of whether they should be included in the bad bit register.

In an embodiment, the memory system further includes a main register configured to identify bits determined to be bad during a burn-in process. Hence, burn-in errors can be addressed by the present invention.

In an embodiment, the main register and the bad bit register are configured as a fuse bit register, and the processor is configured to use the fuse bit register to fuse out words determined to be bad and replace each of the words determined to be bad with a respective redundant address. Hence, bad bits can be fused out so that they are no longer used.

In an embodiment, the bad bit register, the suspect bit register, and the main register are included in a same non-volatile memory device. Hence, a single device can be used to provide the aforementioned registers, thus avoiding the use of other devices to implement the present invention.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

The present invention is directed to a bad bit register for a memory. As used herein, the term "bad bit" refers to a bit associated with one or more errors.

In an embodiment, the present invention provides a method for identifying and fusing out bad bits in the field. This allows for the identification of bits with a high write-error-rate during regular operation, and fusing these bits out so these bits are no longer used.

In an embodiment, two registers are used, namely a bad bit register and a suspect bit register. In another embodiment, three registers are used, namely a main register, a bad bit register, and a suspect bit register.

Figure 1:
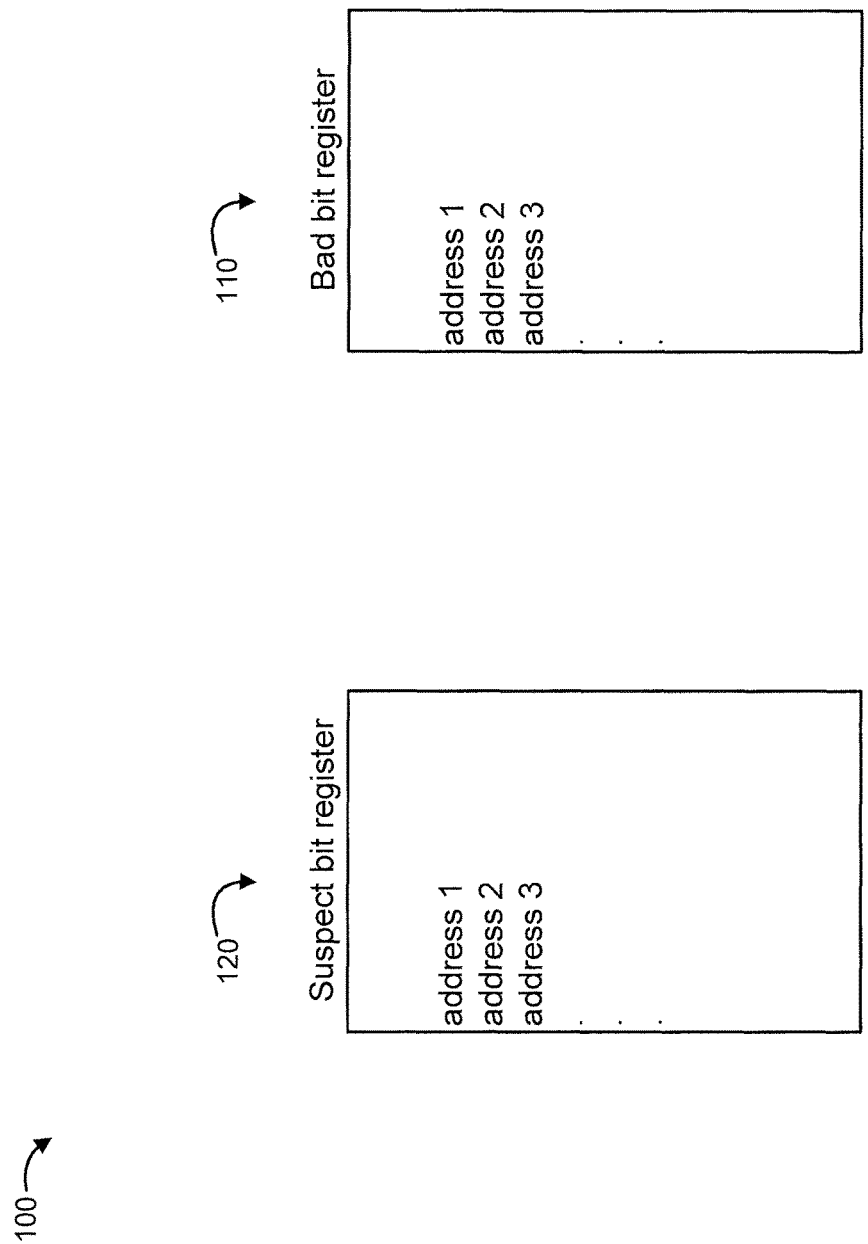
FIG. 1 shows a set of registers 100, in accordance with an embodiment of the present invention.

FIG. 1 shows a set of registers 100, in accordance with an embodiment of the present invention. In the embodiment of FIG. 1, the set of registers 100 include a bad bit register 110 and a suspect register 120.

Figure 2:
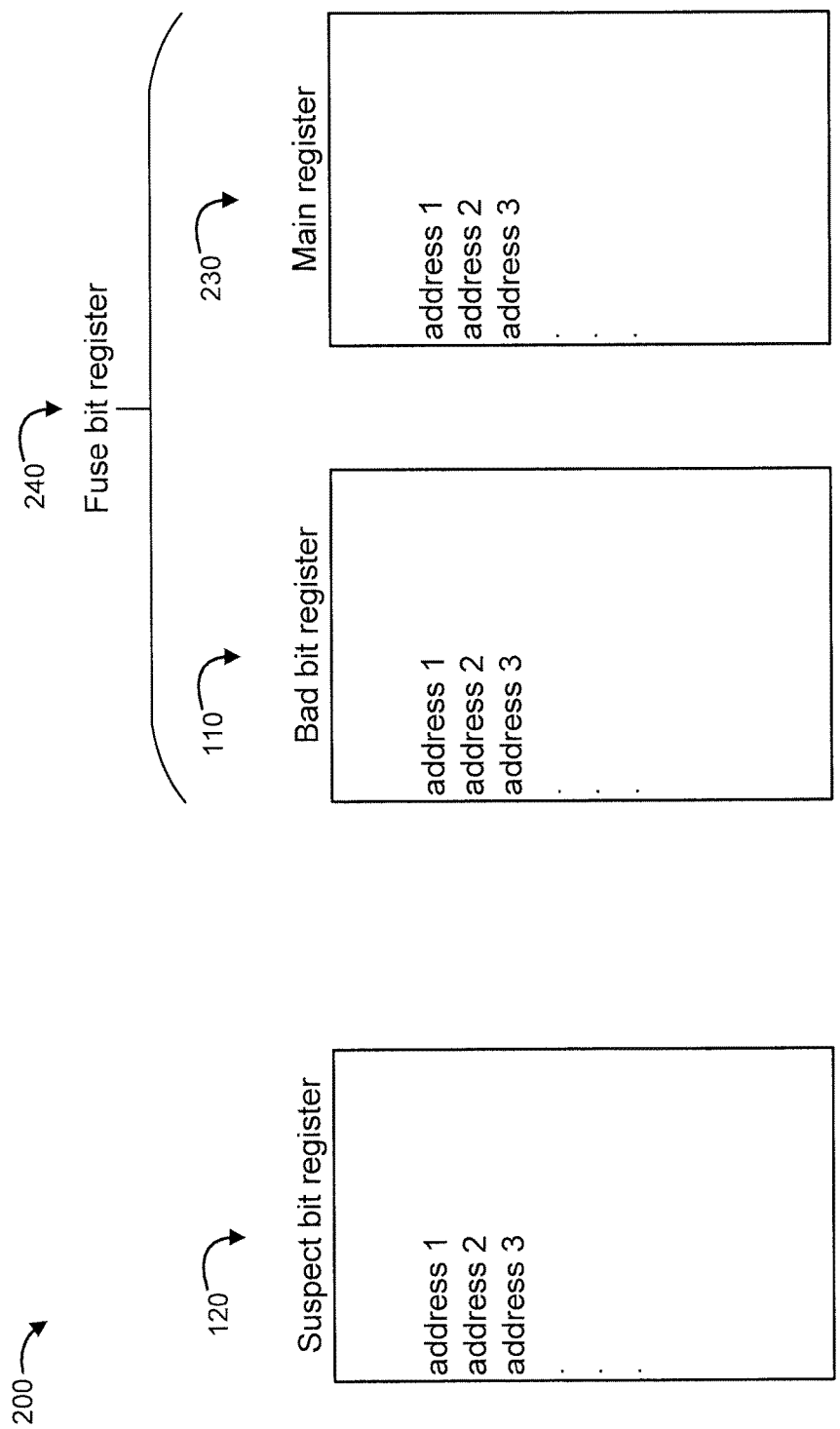
FIG. 2 shows another set of registers 200, in accordance with an embodiment of the present invention.

FIG. 2 shows another set of registers 200, in accordance with an embodiment of the present invention. In the embodiment of FIG. 2, the set of registers 200 include a bad bit register 110, a suspect register 120, and a main register 230. The main register 230 and the bad bit register 110 can form a fuse bit register 240.

Thus, the set of registers 200 of FIG. 2 differ from the set of registers 100 of FIG. 1 by including the main register 230 and by forming the fuse bit register 240 from the main register 230 and the bad bit register 110.

Referring to FIGS. 1 and 2, the bad bit register 110 can formed from the non-volatile memory itself. The bad bit register 110 is used during operation to record the address of words that include bits that have been determined to have bad write-error-rate. When the bad bit 110 register fills up, subsequent addresses are written over the oldest addresses in the bad bit register 110 (the addresses that were written the longest time ago).

The suspect bit register 120 can also formed from the non-volatile memory itself. The suspect bit register 120 is used to identify bad bits to write into the bad bit register 110. Every time an error is detected with error correction code, the address of the bit that was in error is searched for in the suspect bit register 120. If it does not appear, then the address of that bit is written into the suspect bit register 120. If it does appear, then the address of that bit is removed from the suspect bit register 120 and the address of the word including that bit is written into the bad bit register 110. When the suspect bit register 120 fills up, subsequent addresses are written over the oldest addresses in the suspect bit register 120 (the addresses that were written the longest time ago).

Referring to FIG. 2, the main register 230 can be formed from a one-time-programmable memory or from the non-volatile memory itself. The main register 230 must be sufficiently thermally stable so as to store information during the high temperature chip solder process. The main register 230 is used during burn-in to identify bad bits (typically bits that are bad for reasons other than high write-error-rate such as, for example, being electrically shorted or open).

The bad bit register 110 and the main register 230 together form the fuse bit register 240 that is used to fuse out bad words and replace them with redundant addresses.

Hence, the sets of registers 100 and 200 in FIGS. 1 and 2, respectively, advantageously identify and fuse out bad bits in the field. This allows for the identification of bits with a high write-error-rate during regular operation, and fusing these bits out so these bits are no longer used, thus overcoming the aforementioned problem of intrinsic write-error-rate.

Figure 3:
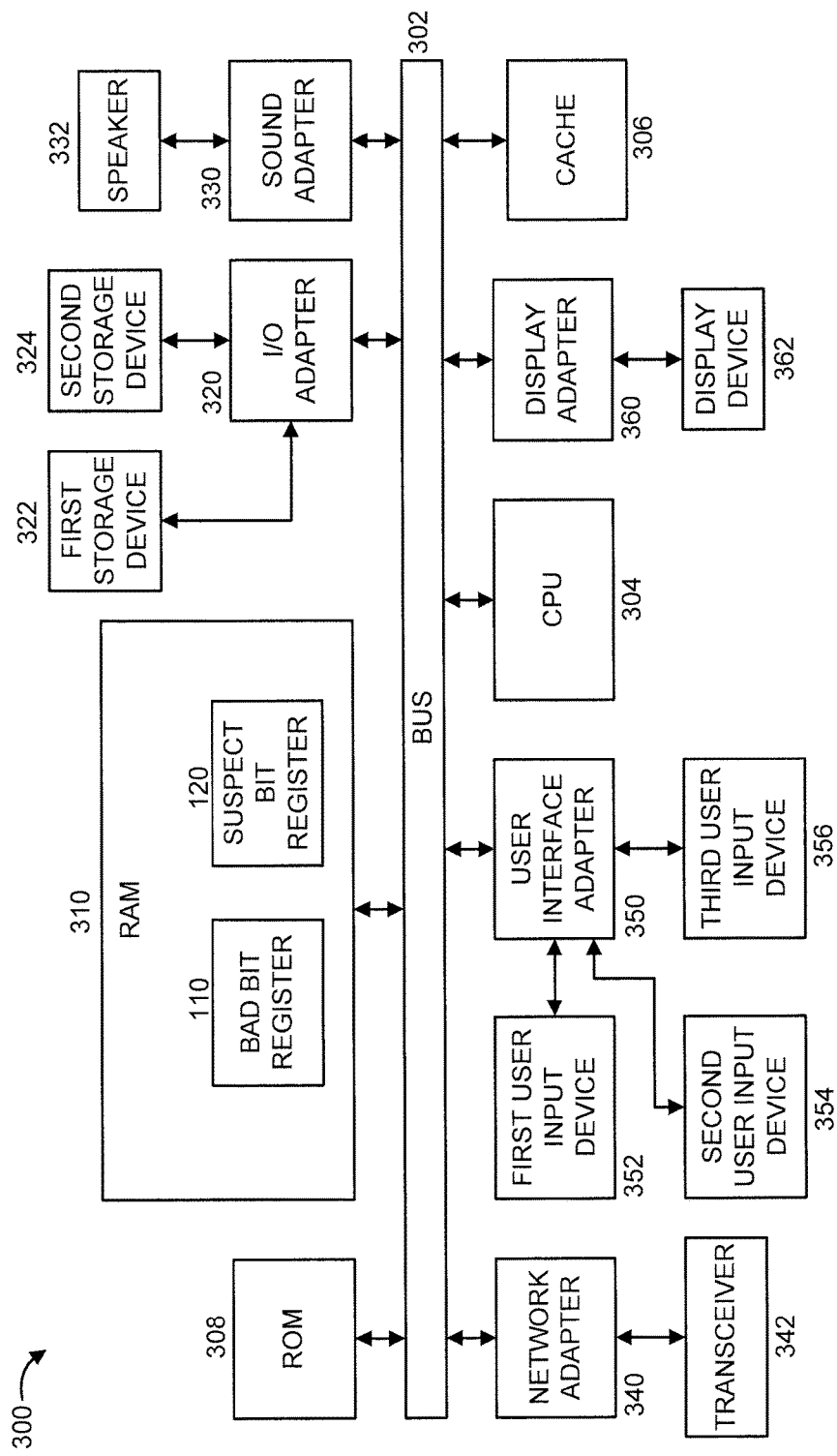
FIG. 3 shows an exemplary processing system 300 to which the invention principles may be applied, in accordance with an embodiment of the present invention.

FIG. 3 shows an exemplary implementation of the set of registers 100 of FIG. 1. In particular, FIG. 3 shows an exemplary processing system 300 with the bad bit register 110 and the suspect bit register 120 of FIG. 1 included in a non-volatile memory, in accordance with an embodiment of the present invention.

The processing system 300 includes at least one processor (CPU) 304 operatively coupled to other components via a system bus (or other communication medium, but hereinafter referred to as "system bus" for the sake of illustration and example) 302. A cache 306, a Read Only Memory (ROM) 308, a Random Access Memory (RAM) 310, an input/output (I/O) adapter 320, a sound adapter 330, a network adapter 340, a user interface adapter 350, and a display adapter 360, are operatively coupled to the system bus 302.

In the embodiment of FIG. 3, the RAM 310 includes the bad bit register 110 and the suspect bit register 120. In an embodiment, the RAM 310 is implemented by a Spin Torque Magnetoresistive RAM (RAM) having magnetic tunnel junctions. Of course, the present invention is not limited to the preceding type of RAM and, thus, other non-volatile memories types can also be used in accordance with the teachings of the present invention, while maintaining the spirit of the present invention.

A first storage device 322 and a second storage device 324 are operatively coupled to system bus 302 by the I/O adapter 320. The storage devices 322 and 324 can be any of a disk storage device (e.g., a magnetic or optical disk storage device), a solid state magnetic device, and so forth. The storage devices 322 and 324 can be the same type of storage device or different types of storage devices.

A speaker 332 is operatively coupled to system bus 302 by the sound adapter 330. A transceiver 342 is operatively coupled to system bus 302 by network adapter 340. A display device 362 is operatively coupled to system bus 302 by display adapter 360.

A first user input device 352, a second user input device 354, and a third user input device 356 are operatively coupled to system bus 302 by user interface adapter 350. The user input devices 352, 354, and 356 can be any of a keyboard, a mouse, a keypad, an image capture device, a motion sensing device, a microphone, a device incorporating the functionality of at least two of the preceding devices, and so forth. Of course, other types of input devices can also be used, while maintaining the spirit of the present invention. The user input devices 352, 354, and 356 can be the same type of user input device or different types of user input devices. The user input devices 352, 354, and 356 are used to input and output information to and from system 300.

Of course, the processing system 300 may also include other elements (not shown), as readily contemplated by one of skill in the art, as well as omit certain elements. For example, various other input devices and/or output devices can be included in processing system 300, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized as readily appreciated by one of ordinary skill in the art. These and other variations of the processing system 300 are readily contemplated by one of ordinary skill in the art given the teachings of the present invention provided herein.

Figure 4:
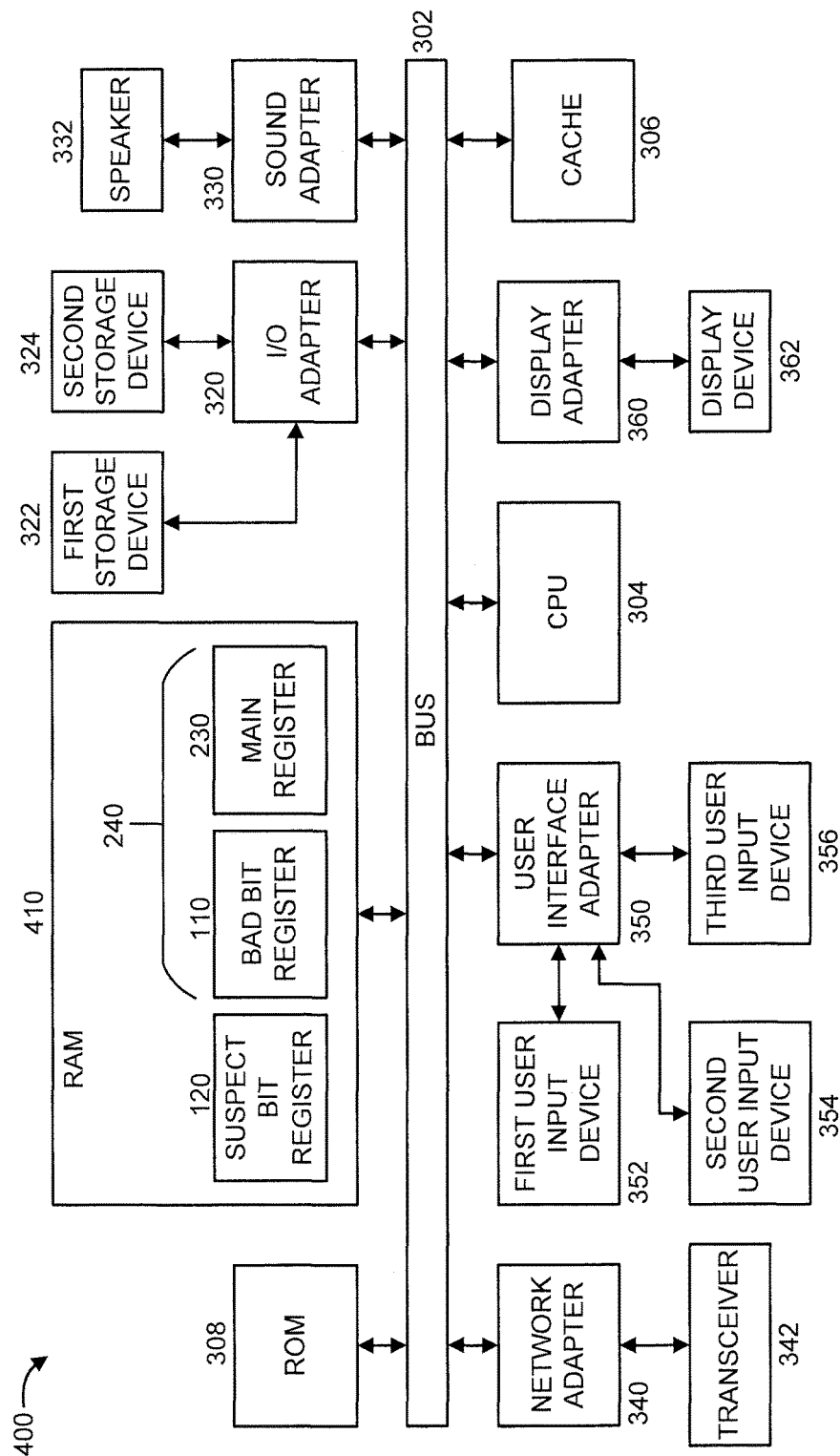
FIG. 4 shows another exemplary processing system 400 to which the invention principles may be applied, in accordance with an embodiment of the present invention.
Figure 5:
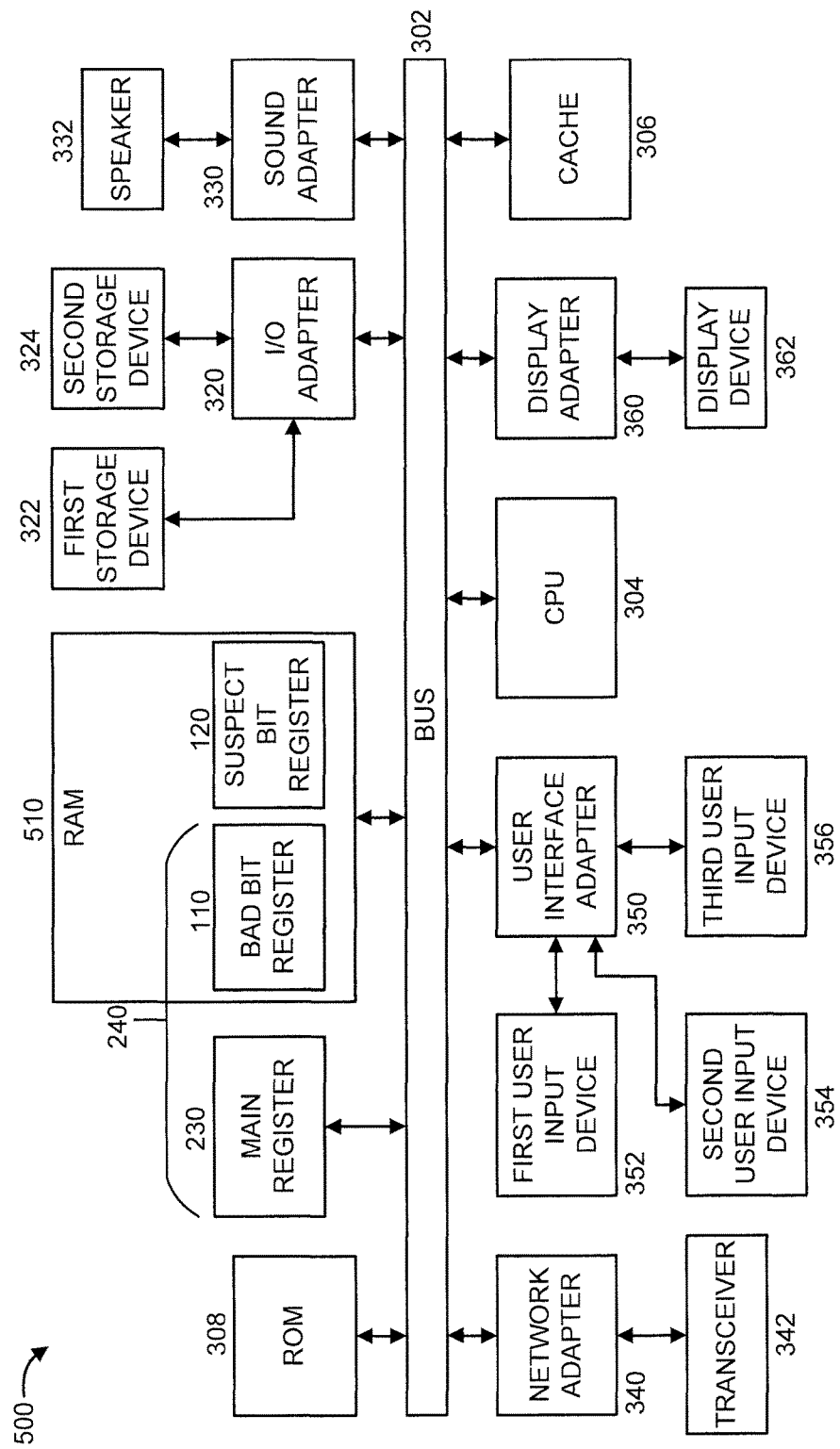
FIG. 5 shows yet another exemplary processing system 500 to which the invention principles may be applied, in accordance with an embodiment of the present invention.

FIGS. 4 and 5 show respective embodiments of the set of registers 200 of FIG. 2. In particular, FIG. 4 shows an exemplary processing system 400 with the bad bit register 110, the suspect bit register 120, and the main register 230 of FIG. 2 all included in a non-volatile memory, in accordance with an embodiment of the present invention. FIG. 5 shows an exemplary processing system 500 with the bad bit register 110 and the suspect bit register 120 of FIG. 2 included in a non-volatile memory, while the main register 230 of FIG. 2 is formed from a one-time-programmable memory, in accordance with an embodiment of the present invention.

Thus, the computer processing system 400 of FIG. 4 differs from the computer processing system 300 of FIG. 3 by also including the main register 230, with the main register 230 being included in the RAM 410. The computer processing system 500 of FIG. 5 differs from the computer processing system 300 of FIG. 3 by also including the main register 230, with the main register 230 being included in a one-time-programmable memory (and not the RAM 510). Additionally regarding FIGS. 4-5, the main register 230 and the bad bit register 110 form the fuse bit register 240.

A method 600 will now be described with respect to FIG. 6. It is to be appreciated that the following described herein can perform the method 600 of FIG. 6: the set of registers 100 of FIG. 1; and the computer processing system 300 of FIG. 3. It is to be further appreciated that the following described herein can also perform the method 600 of FIG. 6, with the main register 230 not being used: the set of registers 200 of FIG. 2; the computer processing system 400 of FIG. 4; and the computer processing system 500 of FIG. 5.

Figure 6:
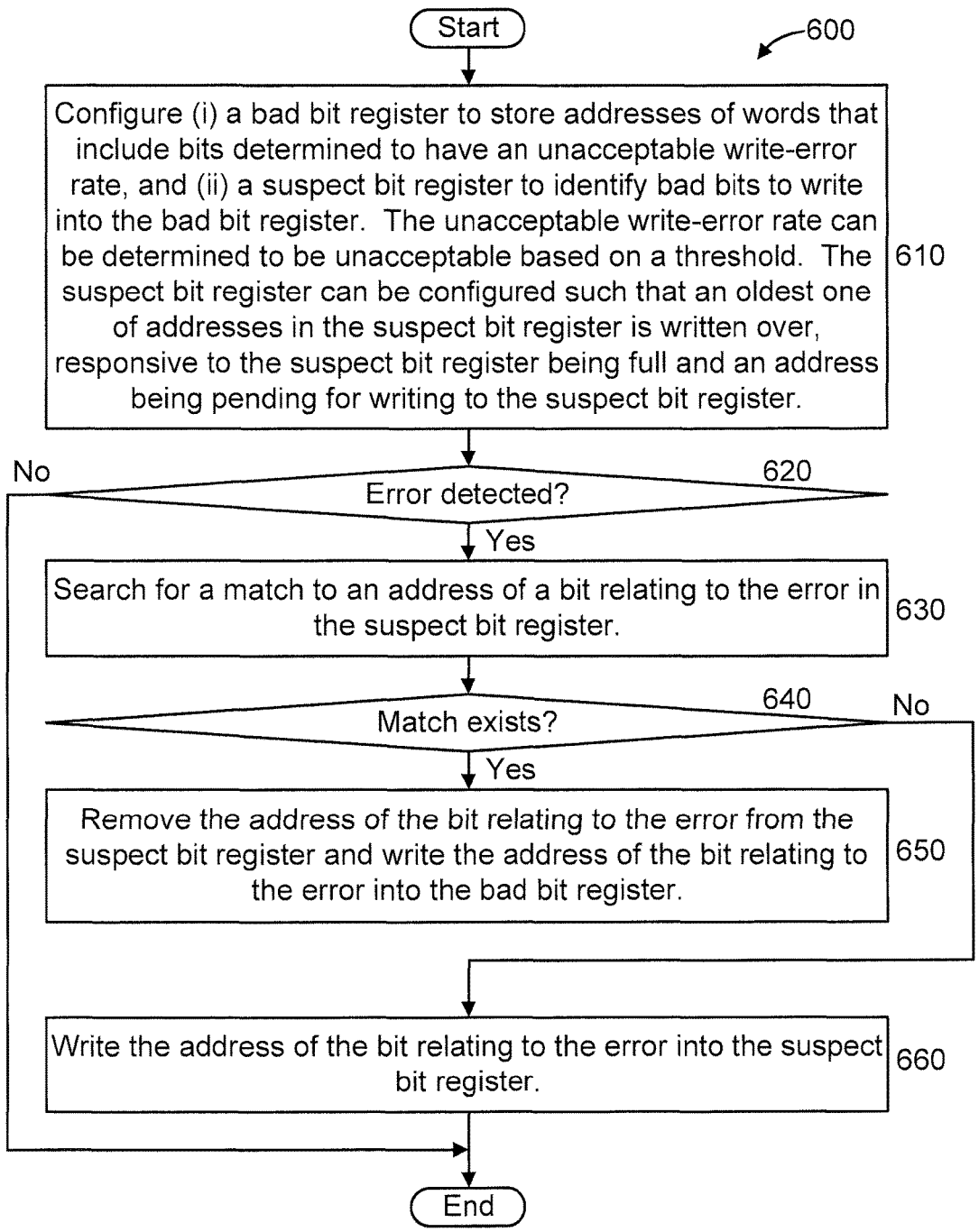
FIG. 6 shows an exemplary method 600 for managing bad bits, in accordance with an embodiment of the present invention.

FIG. 6 shows an exemplary method 600 for managing bad bits, in accordance with an embodiment of the present invention. The method 600 involves the following: a bad bit register (e.g., bad bit register 110 of FIGS. 1 and 3); and a suspect bit register (e.g., suspect bit register 120 of FIGS. 1 and 3).

At step 610, configure (i) a bad bit register to store addresses of words that include bits determined to have an unacceptable write-error rate, and (ii) a suspect bit register to identify bad bits to write into the bad bit register. In an embodiment, the unacceptable write-error rate can be determined to be unacceptable based on a threshold. In an embodiment, the suspect bit register can be configured such that an oldest one of addresses in the suspect bit register is written over, responsive to the suspect bit register being full and an address being pending for writing to the suspect bit register.

At step 620, determine whether an error has been detected (e.g., using error correction code). If so, then proceed to step 630. Otherwise, the method is terminated.

At step 630, search for a match to an address of a bit relating to the error in the suspect bit register.

At step 640, determine whether the match exists. If so, then proceed to step 650. Otherwise, proceed to step 660.

At step 650 (match exists), remove the address of the bit relating to the error from the suspect bit register and write the address of the bit relating to the error into the bad bit register. It is to be appreciated that the bit relating to the error can be considered to have suffered two failures, a first failure that results in the address of the bit being placed in the suspect bit register and a second failure that results in the address of the bit being placed in the bad bit register.

At step 660 (match does not exist), write the address of the bit relating to the error into the suspect bit register.

A method 700 will now be described with respect to FIGS. 7-8. It is to be appreciated that the following described herein can perform the method 700 of FIGS. 7-8: the set of registers 200 of FIG. 2; the computer processing system 400 of FIG. 4; and the computer processing system 500 of FIG. 5.

Figure 7:
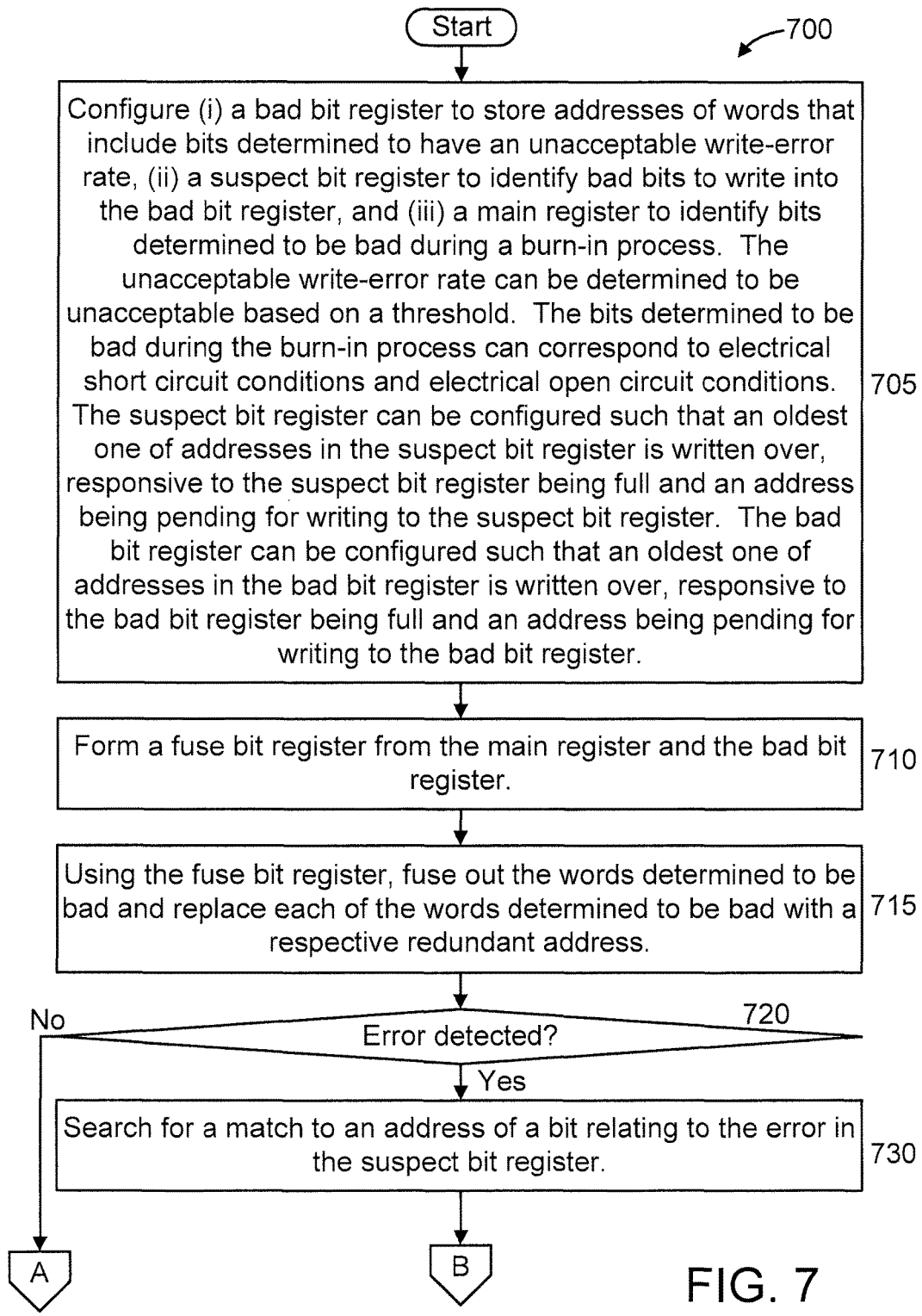
FIGS. 7-8 show another exemplary method 700 for managing bad bits, in accordance with an embodiment of the present invention.
Figure 8:
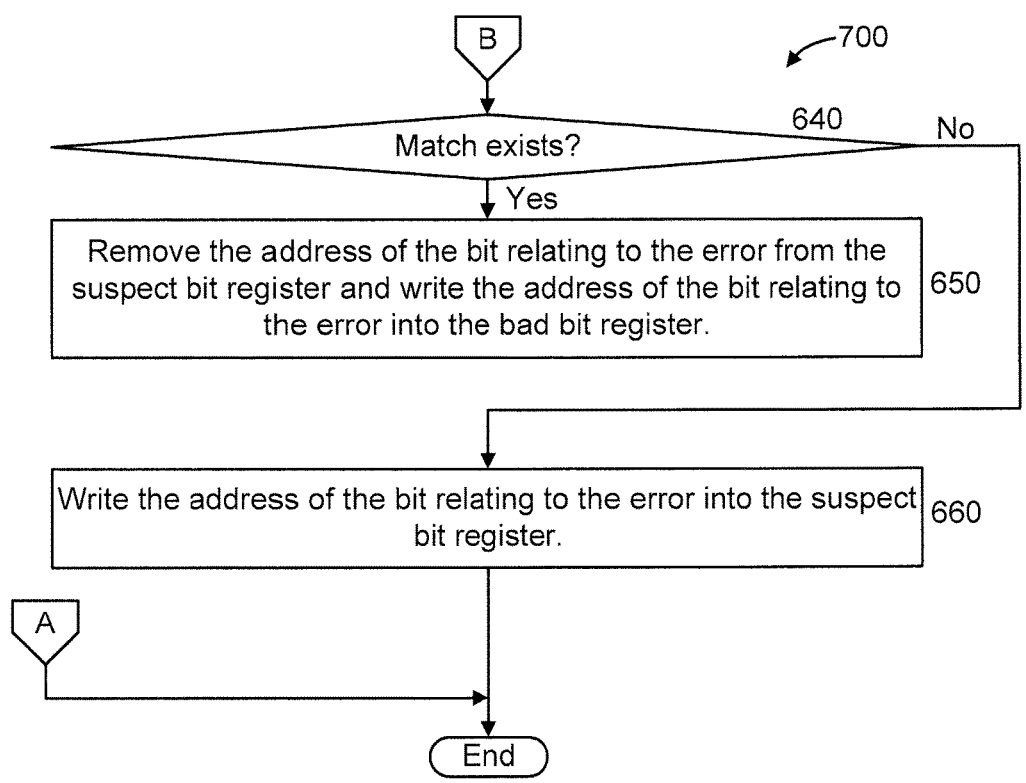

FIGS. 7-8 show another exemplary method 700 for managing bad bits, in accordance with an embodiment of the present invention. The method 700 involves the following: a bad bit register (e.g., bad bit register 110 of FIGS. 2, 4, and 5); a suspect bit register (e.g., suspect bit register 120 of FIGS. 2, 4, and 5); a main register (e.g., main register 230 of FIGS. 2, 4, and 5); and a fuse bit register (e.g., fuse bit register 240 of FIGS. 2, 4, and 5).

At step 705, configure (i) a bad bit register to store addresses of words that include bits determined to have an unacceptable write-error rate, (ii) a suspect bit register to identify bad bits to write into the bad bit register, and (iii) a main register to identify bits determined to be bad during a burn-in process. In an embodiment, the unacceptable write-error rate can be determined to be unacceptable based on a threshold. In an embodiment, the bits determined to be bad during the burn-in process can correspond to electrical short circuit conditions and electrical open circuit conditions. In an embodiment, the suspect bit register can be configured such that an oldest one of addresses in the suspect bit register is written over, responsive to the suspect bit register being full and an address being pending for writing to the suspect bit register. In an embodiment, the bad bit register can be configured such that an oldest one of addresses in the bad bit register is written over, responsive to the bad bit register being full and an address being pending for writing to the bad bit register.

At step 710, form a fuse bit register from the main register and the bad bit register. The fuse bit register is for fusing out words determined to be bad and replacing the words determined to be bad with a respective redundant address.

At step 715, using the fuse bit register, fuse out the words determined to be bad and replace each of the words determined to be bad with a respective redundant address.

At step 720, determine whether an error has been detected (e.g., using error correction code). If so, then proceed to step 730. Otherwise, the method is terminated.

At step 730, search for a match to an address of a bit relating to the error in the suspect bit register.

At step 740, determine whether the match exists. If so, then proceed to step 750. Otherwise, proceed to step 760.

At step 750 (match exists), remove the address of the bit relating to the error from the suspect bit register and write the address of the bit relating to the error into the bad bit register. It is to be appreciated that the bit relating to the error can be considered to have suffered two failures, a first failure that results in the address of the bit being placed in the suspect bit register and a second failure that results in the address of the bit being placed in the bad bit register.

At step 760 (match does not exist), write the address of the bit relating to the error into the suspect bit register.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as SMALLTALK, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A memory device, comprising:
   a non-volatile random access memory, including:
      a suspect bit register configured to store addresses of bits that are determined to have had errors; and
      a bad bit register configured to store addresses of bits that both (i) appeared in the suspect bit register due to a first error and (ii) are determined to have had a second error.

2. The memory device of claim 1, wherein the suspect bit register is configured to store the addresses of the bits that are determined to have had the errors occurring subsequent to a burn-in process, and the memory device further comprises a main register configured to identify bits determined to have errors during a burn-in process.

3. The memory device of claim 2, wherein the main register and the bad bit register are configured as a fuse bit register.

4. The memory device of claim 3, wherein the main register and the bad bit register are comprised in the non-volatile random access memory.

5. The memory device of claim 2, wherein the bits determined to be bad during the burn-in process correspond to electrical short circuit conditions and electrical open circuit conditions.

6. The memory device of claim 2, wherein the main register is included in the non-volatile random access memory.

7. The memory device of claim 2, wherein the main register is included in a one-time-programmable memory device.

8. The memory device of claim 1, wherein the non-volatile random access memory is a Spin Torque Magnetoresistive Random Access Memory having magnetic tunnel junctions.

9. The memory device of claim 1, wherein an oldest one of addresses in the suspect bit register is written over, responsive to the suspect bit register being full and an address being pending for writing to the suspect bit register.

10. The memory device of claim 1, wherein an oldest one of the addresses in the bad bit register is written over, responsive to the bad bit register being fill and an address being pending for writing to the bad bit register.

11. A memory system, comprising:
    a bad bit register configured to store addresses of words that include bits determined to have an unacceptable write-error rate;
    a suspect bit register configured to identify bad bits to write into the bad bit register;
    a processor, configured to:
       search for an address of a bit relating to the error in the suspect bit register, responsive to detecting an error using an error correction code, and
       remove the address of the bit relating to the error from the suspect bit register and write the address of the bit relating to the error into the bad bit register, responsive to a presence of the match.

12. The memory system of claim 11, wherein the processor is configured to write the address of the bit relating to the error into the suspect bit register, responsive to an absence of the match.

13. The memory system of claim 11, further comprising a main register configured to identify bits determined to be bad during a burn-in process.

14. The memory system of claim 13, wherein the main register and the bad bit register are configured as a fuse bit register, and wherein the processor is configured to use the fuse bit register to fuse out words determined to be bad and replace each of the words determined to be bad with a respective redundant address.

15. The memory system of claim 11, wherein the bad bit register, the suspect bit register, and the main register are comprised in a same non-volatile memory device.

16. The memory system of claim 11, wherein the bad bit register and the suspect bit register are comprised in a same non-volatile memory device, and the main register is comprised in a different non-volatile memory device.

* * * * *